United States Patent
Athavale et al.

(10) Patent No.: US 7,263,639 B2
(45) Date of Patent: *Aug. 28, 2007

(54) COMBINATORIAL AT-SPEED SCAN TESTING

(75) Inventors: Atul S. Athavale, Chandler, AZ (US); Jason R. Ng, Hacienda Heights, CA (US)

(73) Assignee: Intel Corporation, Santa Clara, CA (US)

( * ) Notice: Subject to any disclaimer, the term of this patent is extended or adjusted under 35 U.S.C. 154(b) by 312 days.

This patent is subject to a terminal disclaimer.

(21) Appl. No.: 10/955,615

(22) Filed: Sep. 30, 2004

(65) Prior Publication Data

US 2006/0069973 A1   Mar. 30, 2006

(51) Int. Cl.
*G01R 31/28* (2006.01)
*G06F 11/00* (2006.01)
(52) U.S. Cl. .............. 714/726; 714/733; 714/738
(58) Field of Classification Search ............... None
See application file for complete search history.

(56) References Cited

U.S. PATENT DOCUMENTS

| | | | | |
|---|---|---|---|---|
| 5,281,864 | A * | 1/1994 | Hahn et al. .................. 327/202 |
| 6,000,051 | A * | 12/1999 | Nadeau-Dostie et al. ... 714/727 |
| 6,961,885 | B2 * | 11/2005 | Man et al. .................. 714/727 |
| 6,988,232 | B2 * | 1/2006 | Ricchetti et al. ............ 714/736 |
| 2003/0084413 | A1 | 5/2003 | Varney |
| 2003/0093734 | A1 | 5/2003 | Zhang et al. |
| 2004/0064769 | A1 | 4/2004 | Gupte et al. |
| 2004/0267480 | A1 * | 12/2004 | Day .......................... 702/117 |

OTHER PUBLICATIONS

Samaranayake, S. et al., "Dynamic Scan: Driving Down the Cost of Test," IEEE, vol. 35, No. 10, Oct. 2002, pp. 63-68.
Neil, Bob, "How to generate at-speed scan vectors," EE design, May 9, 2003. URL:http://www.eedesign.com/article/showArticle.jhtml?articleId=17408375.
Lin, X. et al., "High-Frequency, At-Speed Scan Testing," IEEE, vol. 20, No. 5, Sep./Oct. 2003, pp. 17-25.
Swanson, B. et al., "At-speed testing made easy," EE design, Jun. 3, 2004. URL:http://www.eedesign.com/article/showArticle.jhtml?articleId=21401421.

* cited by examiner

*Primary Examiner*—Phung My Chung
(74) *Attorney, Agent, or Firm*—Blakely, Sokoloff, Taylor & Zafman LLP

(57) ABSTRACT

A combinatorial at-speed scan testing. A processor including a plurality of distributed slave counters. Each distributed slave counter coupled to a group of scan chains, each distributed slave counter to generate shift-enable-flop signals to be received by the group of scan chains coupled to each distributed slave counter, the shift-enable-flop signals based at least in part on an external shift-enable signal received by the processor. A scan test controller coupled to the plurality of distributed slave counters to provide control signals to the plurality of distributed slave counters to perform an at-speed test of the processor.

20 Claims, 14 Drawing Sheets

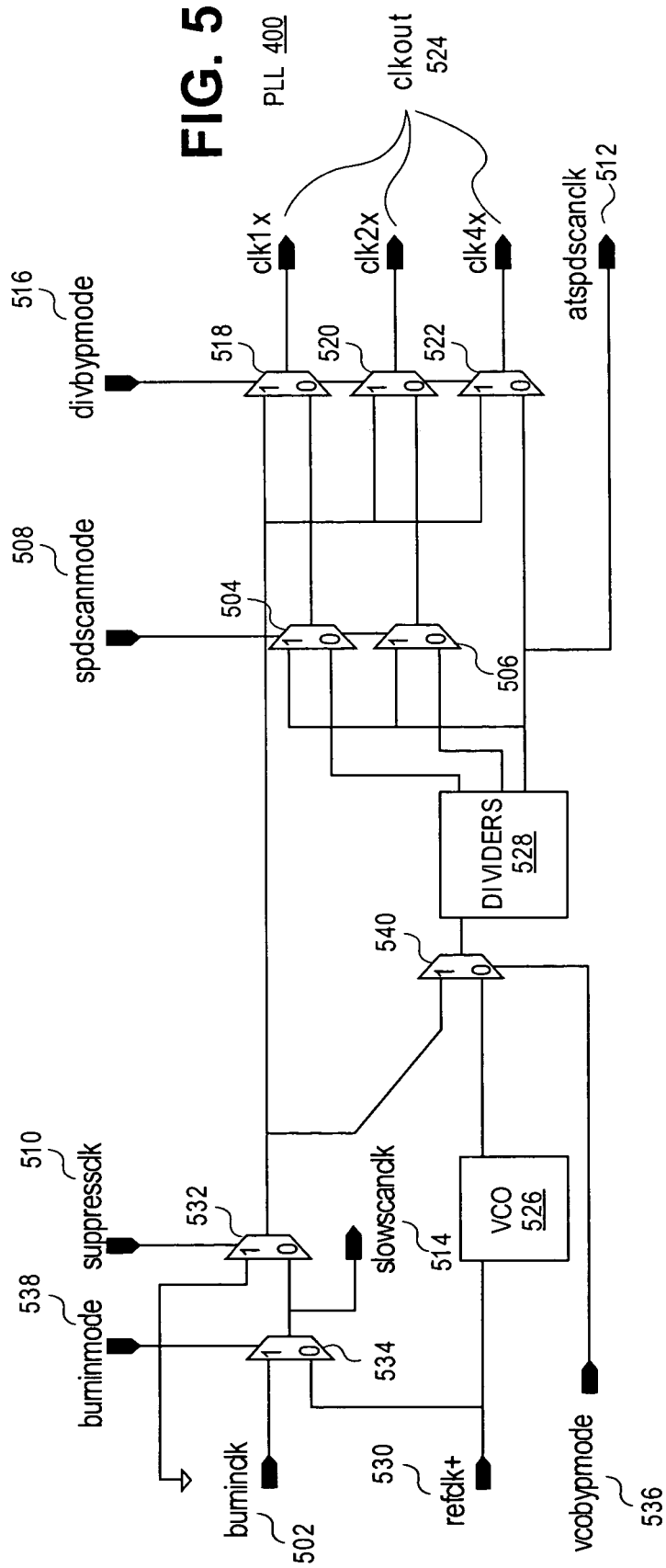
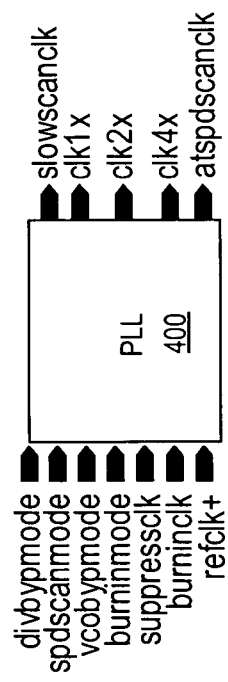
FIG. 5
FIG. 4

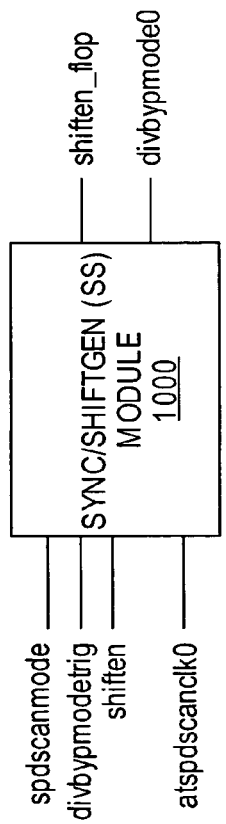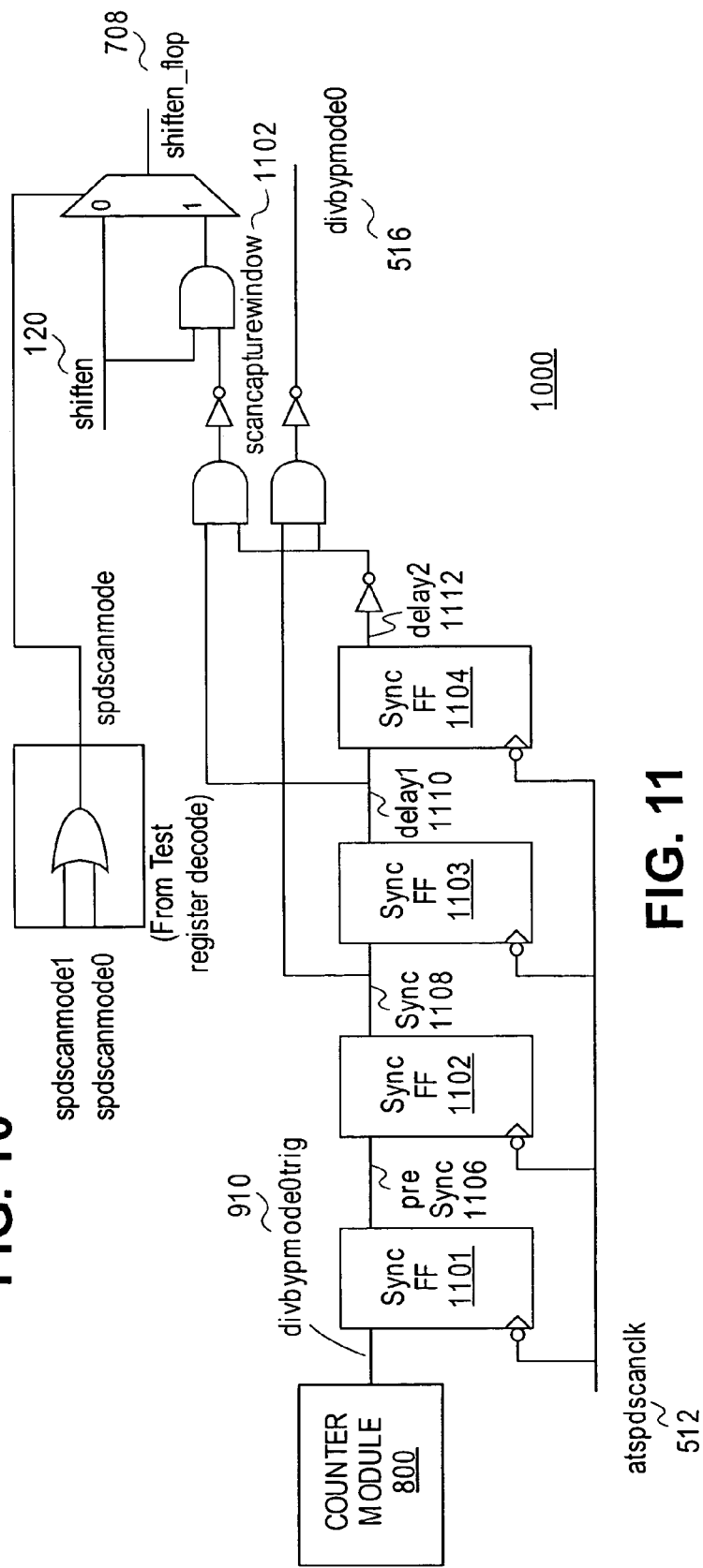
FIG. 10
FIG. 11

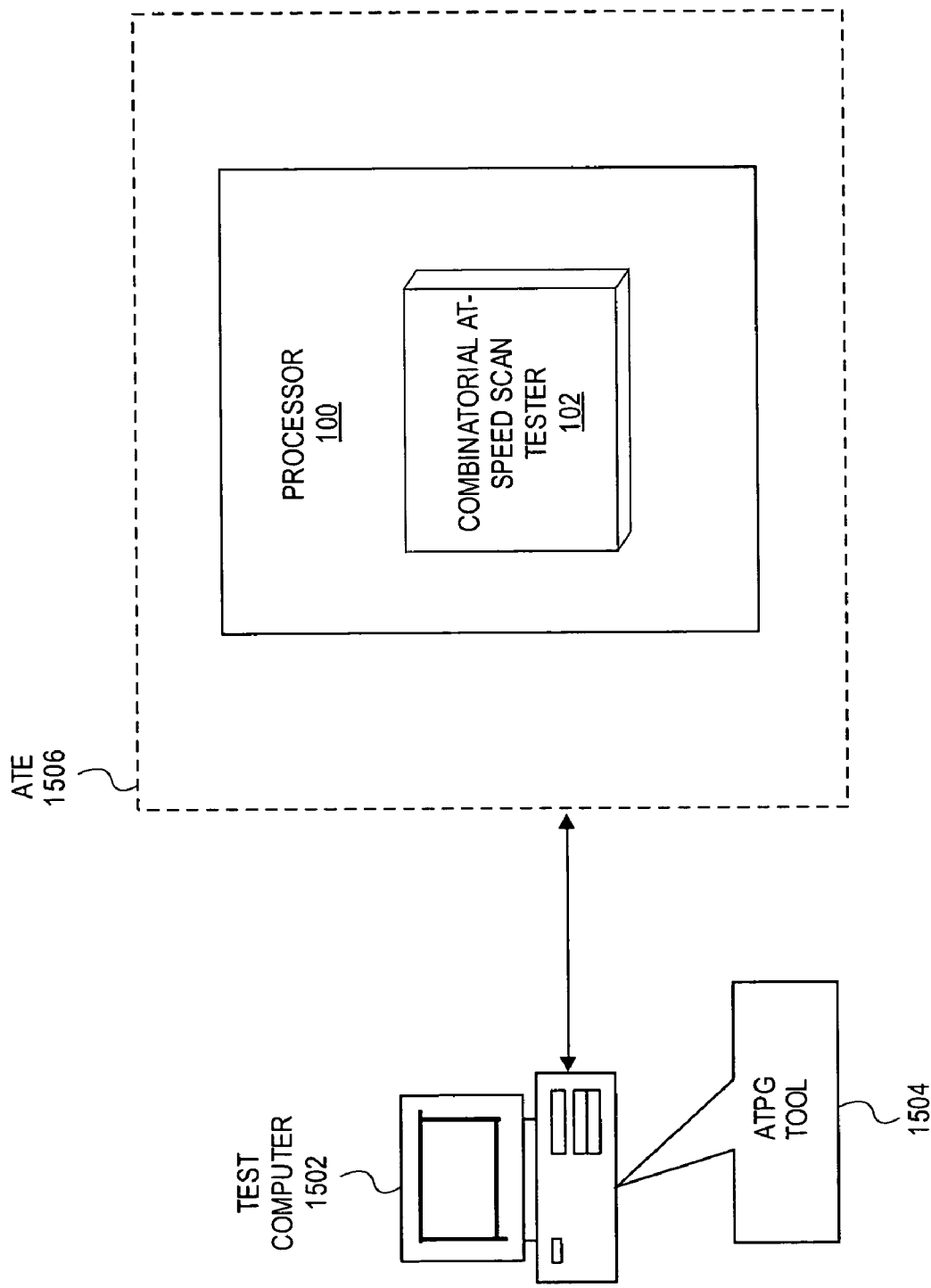

COMBINATORIAL AT-SPEED SCAN TESTING

BACKGROUND

1. Field

Embodiments of the invention relate to the field of system testing and more specifically, but not exclusively, to combinatorial at-speed scan testing.

2. Background Information

Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (a.k.a. "functional testing") as well as detecting fabrication defects (a.k.a., "structural testing").

At-speed testing refers to testing techniques to detect defects that are only apparent when the circuit is running at system speed. Many time-based defects cannot be detected unless the circuit is run at-speed. Time related defects that occur at-speed include high impedance shorts, in-line resistance, and cross talk between signals.

Two fault models used in at-speed testing are path-delay fault modeling and transition fault modeling. In general, fault modeling is the translation of physical defects in the circuit to a mathematical construct that can be understood and manipulated by testing software. Path-delay fault modeling tests the combined delay through a predetermined set of logic gates. Transition fault modeling models a gross delay at every logic gate terminal. Transition faults include slow-to-rise and slow-to-fall delays at a gate terminal.

At-speed scan testing for path-delay fault modeling and transition fault modeling involve similar procedures. In general, a test pattern is loaded into a scan chain. The test pattern is launched into the circuit under test and the results captured by a single or a pair of at-speed clock pulses. And then the results of the test pattern are shifted out of the scan chain.

Two types of transition fault modeling are launch-off-shift and broadside. In the launch-off-shift technique, the last shift of the scan chain load also serves as the launch event. This last shift and the capture are skewed close together to produce an at-speed launch-to-capture clock frequency. Launch-off-shift has the advantage of only needing an ATPG tool to create combinatorial test vectors that are quick and easy to create. But the scan chains are shifted at-speed that may contribute to yield loss.

In the broadside approach, the entire scan chain is shifted at slow speed and then a pair of at-speed pulses are used for launch and capture. The results can then be shifted out at slow speed. Thus, broadside does not require the scan chains to shift at-speed, as in launch-off-shift. However, the ATPG pattern must be sequential, which increases the test pattern generation time and may result in higher pattern count. Sequential patterns are more complicated than combinatorial because the ATPG tool has to plan one cycle ahead to account for the fact that data captured in the first cycle is overwritten by data captured in the second cycle.

As integrated circuits becoming smaller and faster, current at-speed testing techniques may fail to detect circuit defects. A failure to detect such defects increases the defects per million (DPM) of a processor. Too many undetected time-based defects directly impacts the quality of products delivered to customers.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4 is a block diagram illustrating one embodiment of a phase-locked loop in accordance with the teachings of the present invention.

FIG. 5 is a block diagram illustrating one embodiment of a phase-locked loop in accordance with the teachings of the present invention.

FIG. 10 is a block diagram illustrating one embodiment of a synchronization/shift generator module in accordance with the teachings of the present invention.

FIG. 11 is a block diagram illustrating one embodiment of a counter module and a synchronization/shift generator module in accordance with the teachings of the present invention.

FIG. 15 is a block diagram illustrating one embodiment of a combinatorial at-speed testing system in accordance with the teachings of the present invention.

DETAILED DESCRIPTION

In the following description, numerous specific details are set forth to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
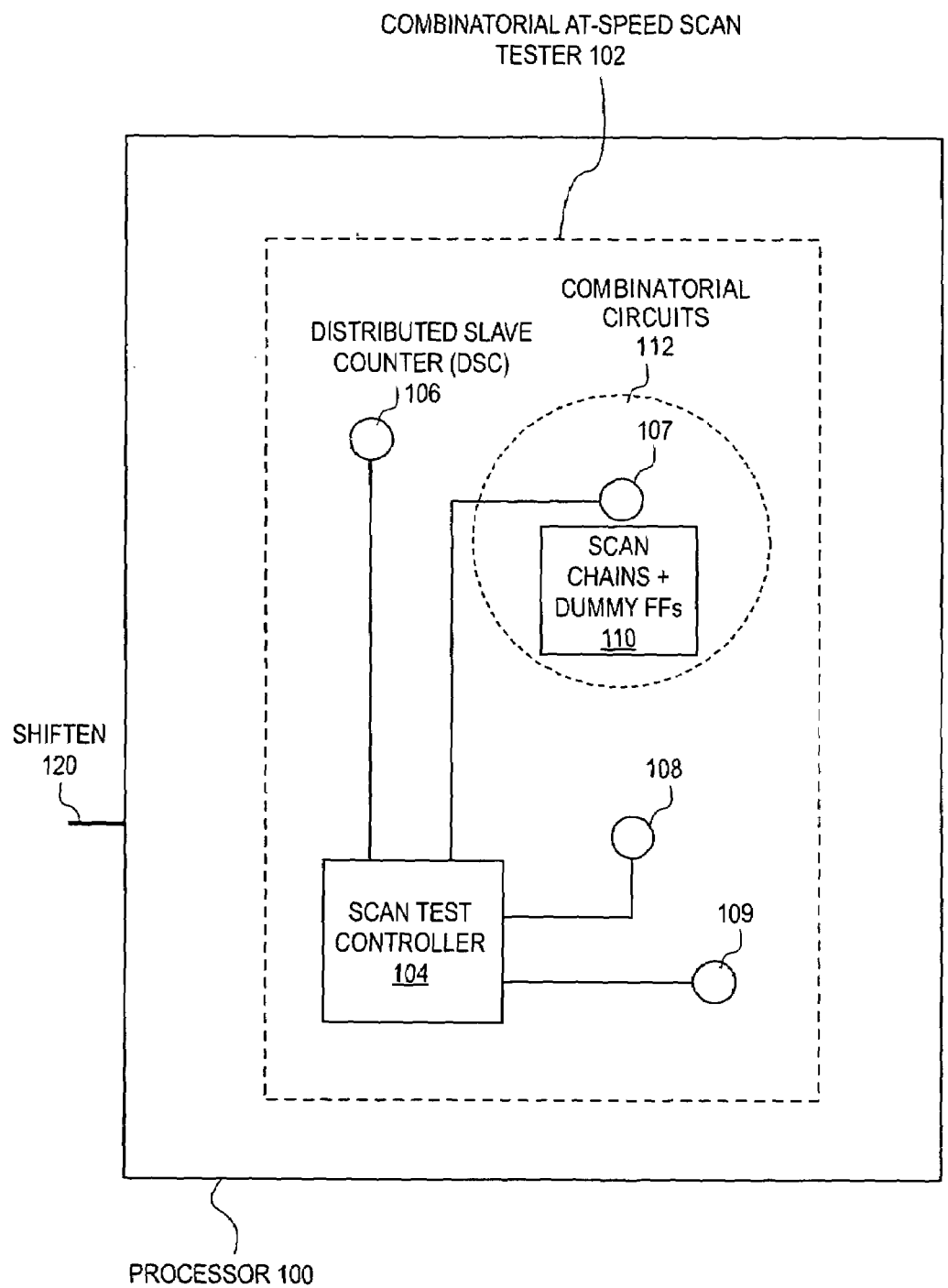
FIG. 1 is a block diagram illustrating one embodiment of a combinatorial at-speed scan tester in accordance with the teachings of the present invention.

Referring to FIG. 1, one embodiment of a processor 100 is shown. Processor 100 includes an embodiment of a combinatorial at-speed scan tester 102. Tester 102 includes a scan test controller 104 coupled to distributed slave counters (DSCs) 106-109. In the embodiment of FIG. 1, DSC 107 may be used to test combinatorial circuits 112. Combinatorial circuits 112 may be coupled to positive and negative clock edge triggered consumer flip-flops (FFs) to be used as storage elements on processor 100 during normal operations. During testing, the consumer FFs may be configured as shift registers for testing combinatorial circuits 112 and for testing the normal storage mode of the consumer FFs themselves. While embodiments described herein refer to flip-flops, it will be understood that other types of storage cells may be used. Further, embodiments herein describe signals as active to refer to logic state '1' and describe signals as inactive to refer to logic state '0'.

Each DSC 106-109 may test combinatorial circuits 112 that are within proximity of the DSC. The number of DSCs may be balanced against the amount of real estate consumed by the DSCs on the die. For example, in one embodiment, if processor 100 includes 1 million consumer FFs, then processor 100 may include 10 DSCs, where each DSC works with 100,000 consumer FFs.

Embodiment of combinatorial at-speed scan tester 102 may provide distributed control of a shift enable (shiften) signal for capturing at-speed scan tests. A slow-speed clock is used to load a scan chain of consumer FFs. A "window" is opened where the slow-speed clock signal is masked and two fast-speed clock pulses pass to the consumer FFs for at-speed testing. The first at-speed clock pulse, which is also the last-shift clock pulse, launches the test pattern and the second at-speed clock pulse captures the results at the scan chain. This "window" is closed and the slow-speed clock signal is used to shift out the at-speed scan test results. In one embodiment, the "window" is generated at each DSC and is synchronized from the scan test controller 104. The selection between the slow-speed clock and the at-speed clock is referred herein as "clock multiplexing."

In embodiments of combinatorial at-speed can tester 102, the opening and closing of the window is tied to an on-board at-speed clock of tester 102. In this particular embodiment, a change in the at-speed clock inherently adjusts the timing and size of the window. Thus, combinatorial at-speed can tester 102 may be scaled to a desired at-speed clock speed without creating control and coordination problems with the generation of the at-speed capture "window."

Embodiments of combinatorial at-speed scan tester 102 may be used to provide at-speed testing with legacy ATPG tools. As will be described below, the ATPG tools may generate test vectors at slow speed, but the launch and capture pulses may be applied at-speed. The ATPG tools will record the results of the test as if the test was performed at slow speed as expected by the ATPG tools. However, a user of the ATPG tools will know that the at-speed test occurred. Embodiments herein allow the use of combinatorial ATPG patterns without significant design overhead. Further, the same ATPG patterns may be used for slow-speed testing as well as at-speed testing.

In one embodiment, dummy FFs 110 are placed at the beginning of each scan chain. As will be described further below, dummy FFs 110 may be used to remove possible corruption of primary values of the first FF in the scan chain so that embodiments of the invention may be used with legacy ATPG tools.

In one embodiment, processor 100 includes a shift enable (shiften) pin 120. Shiften 120 may be used to receive a shift signal from an external source for shifting data in/out of the scan chains. However, shiften 120 is intercepted by the scan test controller 104. Scan test controller 104 coordinates shift timing so that each DSC will pass a shift enable FF (shiften_flop) signal onto their respective scan chains. Shiften_flop mimics shiften 120 except during the at-speed window (discussed further below). The generation of a shiften_flop at each DSC reduces the propagation delay problems associated with using a single external shiften for all consumer FFs and their associated scan chains.

Figure 2A:
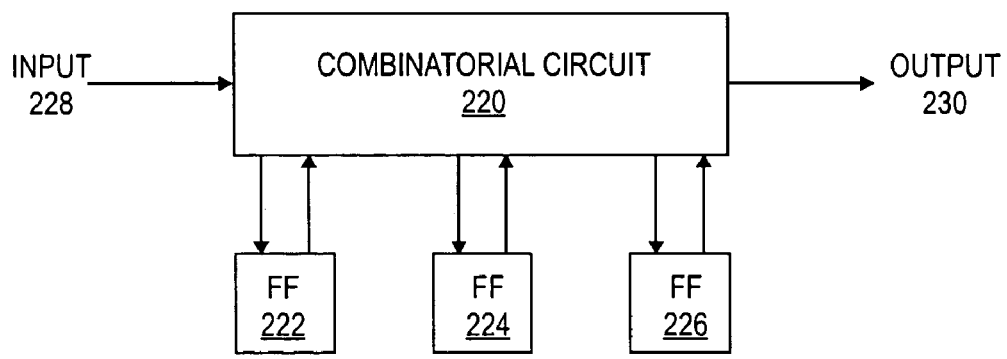
FIG. 2A is a block diagram illustrating one embodiment of a combinatorial at-speed scan tester in accordance with the teachings of the present invention.

Referring to FIG. 2A, an embodiment of a combinatorial circuit 220 is shown. Combinatorial circuit 220 includes input 228 and output 230. Combinatorial circuit 220 is coupled to consumer FFs 222, 224, and 226. During a functional mode, the consumer FFs act as storage cells for use by combinatorial circuit 220.

Figure 2B:
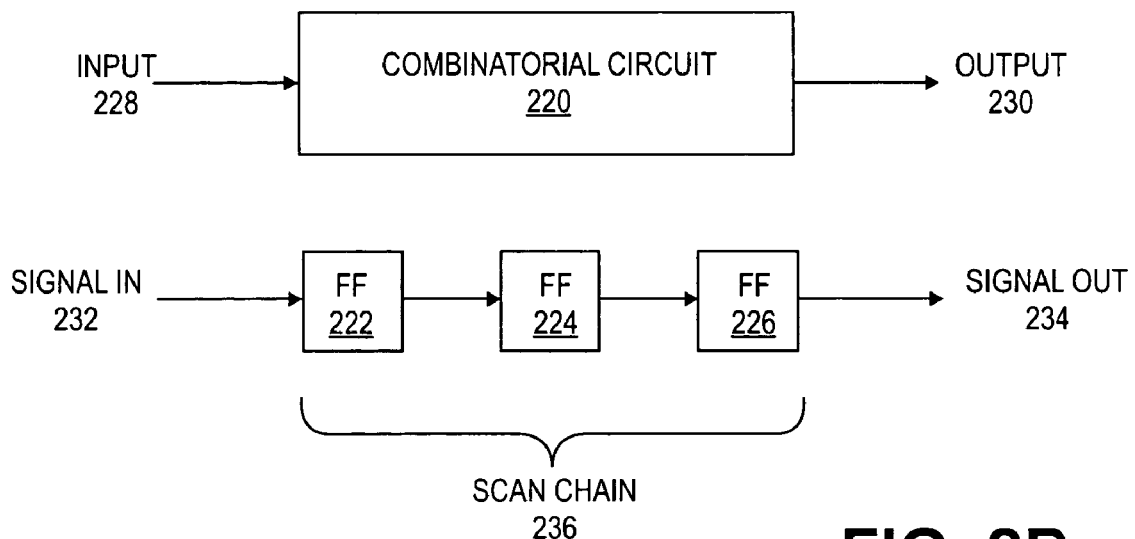
FIG. 2B is a block diagram illustrating one embodiment of a combinatorial at-speed scan tester in accordance with the teachings of the present invention.

In FIG. 2B, the consumer FFs 222, 224, and 226 are in a test mode where a test vector may be shifted in at signal-in 232 and shifted out at signal-out 234. Consumer FFs 222, 224, and 226 form scan chain 236. The test vector is launched into combinatorial circuit 220 from scan chain 236 and the results are captured at scan chain 236. In one embodiment, the storage dependability of consumer FFs 222, 224, and 226 may also be tested. As described further below, scan chain 236 may also include a dummy FF (not shown) in accordance with embodiments described herein.

Figure 2C:
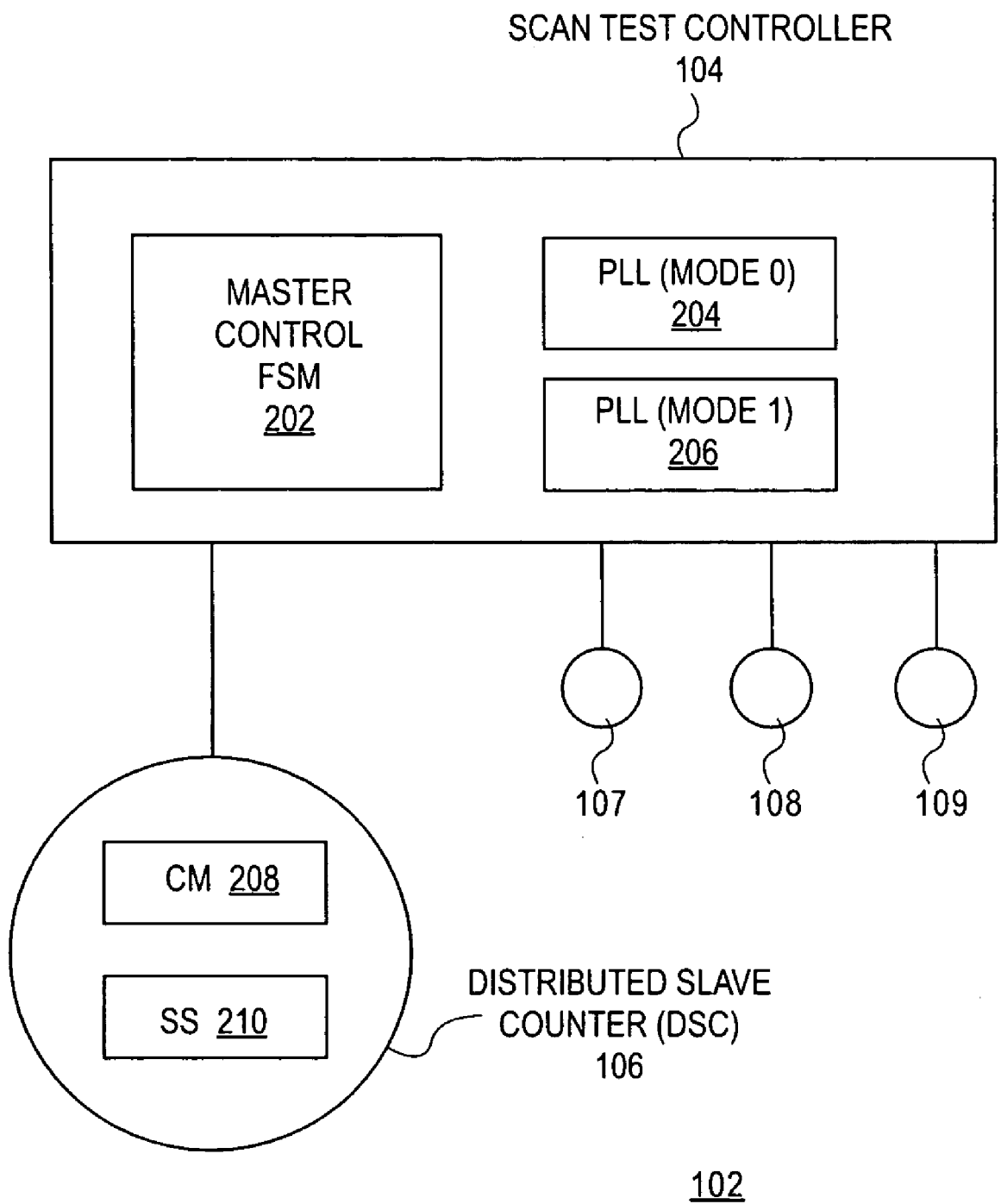
FIG. 2C is a block diagram illustrating one embodiment of a combinatorial at-speed scan tester in accordance with the teachings of the present invention.

Turning to FIG. 2C, an embodiment of combinatorial at-speed scan tester 102 is shown. Scan test controller 102 includes a master control finite state machine (FSM) 202 and a phase lock loop (PLL) 204 associated with mode 0 and PLL 206 associate with mode 1.

Embodiments of the invention may include two or more asynchronous clock domains. Each clock domain may be driven by its own PLL. Different time domains are described herein as "modes." Embodiments herein are described using mode 0 and mode 1, however, it will be understood that alternative embodiments may include one mode or more than two modes.

DSC 106 includes a counter module (CM) 208 and a synchronization/shift generator module (SS) 210. Embodiments of DSCs 107-109 may also each include a CM and a SS.

In one embodiment, ATPG vectors are clock restricted to ensure that all except one asynchronous clock domain suppress the scan capture pulse. In this embodiment, to test multiple clock domains, ATPG vectors for each clock domain are to be used.

In another embodiment, most of the consumer FFs are at a single operating frequency serviced by a single clock tree.

In another embodiment, other clock trees may exist with a single time domain. In this particular embodiment, additional processor pins and different ATPG vectors may be used.

In yet another embodiment, scan chains may not cross their clock domain boundary. Further, scan chains may not cross common frequency boundaries within a clock domain.

Figure 3:
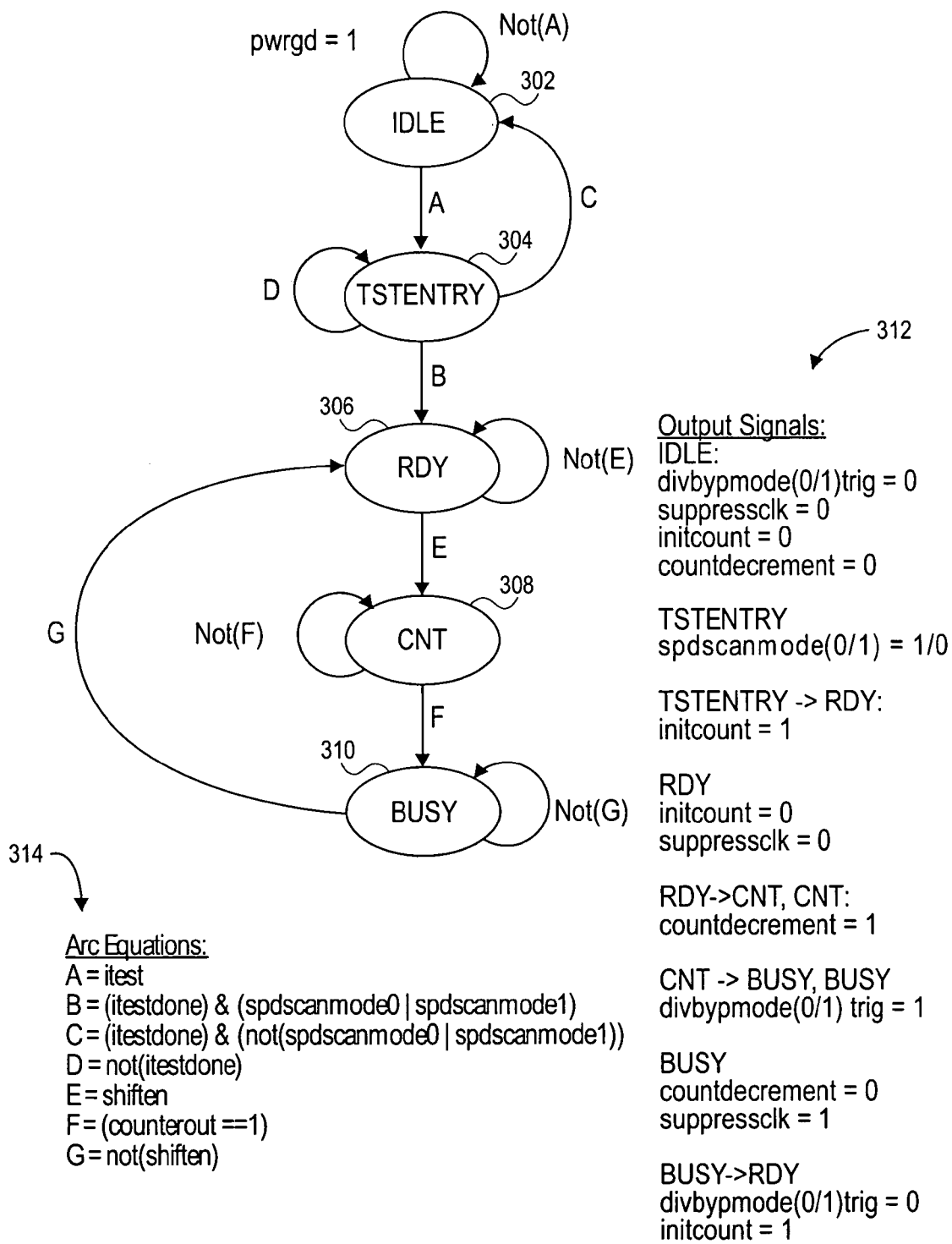
FIG. 3 is a block diagram illustrating one embodiment of a finite state machine in accordance with the teachings of the present invention.

Referring to FIG. 3, an embodiment of a master control FSM 300 is shown. Master control FSM 300 includes an idle (IDLE) state 302, a test entry (TSTENTRY) state 304, a ready (RDY) state 306, a count (CNT) state 308, and a busy (BUSY) state 310. In one embodiment, master control FSM 300 may control the overall at-speed scan testing by generating control signals for the DSCs and PLLs. In one embodiment, the state transitions occur on the negative edge of a slowscanclk signal (discussed further below). Arc equations 314 summarize the transitions between states. Output signals 312 shows the output signals at the various states.

IDLE state 302 is the default state of master control FSM 300 after assertion of a power good (pwrgd) signal. If the test entry sequence is skipped, the master control FSM 300 continues to remain in IDLE state 302 (see Arc Not(A)). All control signals of master control FSM 300 are held to the inactive state during IDLE.

An initialization test (itest) signal transitions FSM 300 to TSTENTRY 304 (see Arc A). During TSTENTRY 304, master control FSM 300 monitors the initialization test done (itestdone) signal (see Arc D). When itestdone is asserted, the transitioning to the test mode of processor 100 is completed. The next clock signal initializes the DSCs using an initialize counters (initcount) signal.

In one embodiment, the counter modules of the DSCs are initialized to the length of the longest scan chain in processor 100. The master control FSM 300 uses this counter value to generate a distributed scan capture event at each DSC independent of the external ATPG pattern, thereby eliminating the propagation delay issues of the external shiften signal.

If itestdone is asserted, but a mode has not been selected, then master control state machine returns to IDLE (see Arc C).

A state change to the RDY 306 may occur when itestdone is signaled and the presence of active values at the speed scan mode 0 (spdscanmode0) or the speed scan mode 1 (spdscanmode1) signals (see Arc B). These signals will be discussed further below, but generally, spdscanmode0 and spdscanmode1 indicate which time domain is to be tested.

At RDY 306, master control FSM 300 monitors the assertion of the external shiften pin 120 (see Arcs E and not(E)). If shiften is asserted, then the counter decrement (countdecrement) signal is asserted with a state transition to the CNT state 308.

In CNT 308, all DSCs decrement until the counter modules reach 1 (see Arc not(F)). Once the counter out (counterout) signal of each DSC reaches 1, all DSCs enable clock multiplexing in the next clock pulse (by asserting divbypmodetrig discussed below) simultaneously with a state transition to BUSY 310 (see Arc F). In one embodiment, one pre-selected DSC feeds its counterout to the master control FSM 300. The counter modules values decrement to 0 on the next clock edge.

In BUSY 310, the counter module value is held steady at 0. The DSCs generate window triggers for de-asserting shiften and clock tree multiplexing to the at-speed clock. These windows are synchronized in the at-speed scan clock domain using synchronization FFs in each SS (discussed below). Window generating signals at all DSCs should cross clock domains on the same at-speed clock (atspdscanclk) edge. In one embodiment, this may be fine tuned by adjusting the skew between the slow scan clock (slowscanclk) and the at-speed clock (atspdscanclk).

On the de-assertion of the shiften external pin 120 (see Arc G), master control FSM 300 transitions from BUSY 310 back to RDY 306. Once back at RDY 306, master control FSM 300 will hold at RDY 306 until shiften is again activated to shift in another ATPG vector. The consumer FFs are insulated from this transition from BUSY 310 to RDY 306 and do not interpret the de-assertion of shiften since the clock multiplexing window has elapsed and the suppressclk signal masks the slowscanclk during BUSY 310 state.

If the de-assertion of the external shiften pin does not occur, such as for the last ATPG vector, then the master control FSM 300 stays in the BUSY state 310. Thus, a new ATPG vector needs to start the initialization process again from the IDLE 302 state.

Turning to FIGS. 4 and 5, an embodiment of a PLL 400 is shown. In one embodiment, each time domain may have its own PLL. Oscillator (VCO) is aligned with reference clock (reflck+) 530 and forwards a clocking signal to dividers 528. Clocking signals clk 1x, 2x, 4x are described as clkout 524 and are sent to the clock trees for the scan chains. As described below, the slow speed clock is received from burninclk 502, and the at-speed clock is received from dividers 528.

In one embodiment, the scan chains are connected to a single clock tree having the same clocking speed. Atspdscanclk 512 and slowscanclk 514 are outputs for tapping uninterrupted clock signals from PLL 400.

Burninclock 502 is coupled to an external clock for generating the slow speed clock signal. Even when the slow speed clock signal is multiplexed out during the at-speed window, burninclock 502 may continue to receive the external slow speed clock and this slow speed clock may always be available. The at-speed clock is also continuously available from dividers 528. This ensures the simultaneous availability of the slow speed clock and the at-speed clock for clock multiplexing. In an embodiment with multiple clock trees within a clock domain, clock trees for the at-speed clock and the slow speed clock need to delay match. In one embodiment, all shift paths are rated at the highest multiple of the clock frequency within the PLL clock domain.

Burninmode 538 is always active for all modes. Burninclk 502 is multiplexed to slowscanclk 514 by multiplexer (mux) 534. As discussed below, while burninclk 502 continually inputs the slow speed clock pulses, whether these slow speed clock pulses reach the consumer FFs from clkout 524 is controlled by suppressclk 510 through mux 532 and by divbymode 516 through muxes 518, 520, and 522.

Mux 504 and mux 506 unify the shift and capture clock pulses of all consumer FFs within a PLL clock domain. Mux 504 and 506 are controlled by speed scan mode (spdscanmode) 508. Spdscanmode 508 is always active during the selected mode, and inactive for non-selected modes. If the spdscanmode is selected then the at-speed time domain of the selected PLL will be forwarded to the scan chains. In FIG. 5, the at-speed clock pulse output of dividers 528 is selected by muxes 504 and 506 when spdscanmode 508 is active.

Suppress clock (suppressclk) 510 gates the passage of duplicate last-shift and capture pulses that exist in the ATPG patterns generated with legacy ATPG tools. Activation of suppressclk 510 prevents slow speed pulses from reaching the consumer FFs by control of mux 532 (discussed further below).

Dividers-bypass-mode (divbypmode) 516 is held active for the passage of the slow speed clock to the clock trees while the ATPG vector is shifted into the scan chains. During the "window" period, divbymode 516 transitions to inactive and suppressclk 510 is active. Muxs 518, 520, and 522 select the outputs of muxes 504 and 506. The output of muxes 504 and 506 has selected the at-speed clock pulses from dividers 528 since spdscanmode 508 is active.

Since suppressclk 510 is active, the output of mux 532 is ground. Thus, two at-speed clock pulses are allowed to pass out of clkout 524 using the control of muxs 518, 520, and 522 by divbymode 516.

When the "window" closes, divbypmode 516 reverts to active such that muxs 518, 520, and 522 select the clock signals from mux 532. However, during the BUSY state, since suppressclk 510 is active, the slow scan clock is not outputted from mux 532. Thus, the scan chains do not receive any more clocking signals during the remainder of the BUSY state. Control of divbymode 516 during this "window" period is by master control FSM 300.

In one embodiment, the majority of consumer FFs operate on the clk4x output. Consumer FFs tested by clk1x and clk2x need to be on separate scan chains. In one embodiment, these separate scan chains will be masked out from the clk4x associated scan chains.

It will be noted that vcobypmode 536 and mux 540 are not applicable to embodiments of the invention, but are included to show completeness of PLL 400.

In one embodiment, the signals of PLL 400 may have values as show below in Table 1.

TABLE 1

| SIGNAL | STATE |
| --- | --- |
| Suppressclk | dynamic |
| Burninmode | 1 |
| Vcobypmode | 0 |
| Spdscanmode | 1 |
| Divbypmode | dynamic for time domain under test |
| | 1 for time domains not under test |
| Refclk+ | 100 MHz |
| Burninclk | 20 MHz |
| Clk1x, Clk2x, Clk4x (clk4x is the main core clock) | 400 MHz (capture + last shift) |
| | 20 MHz (shift) |

Figure 6A:
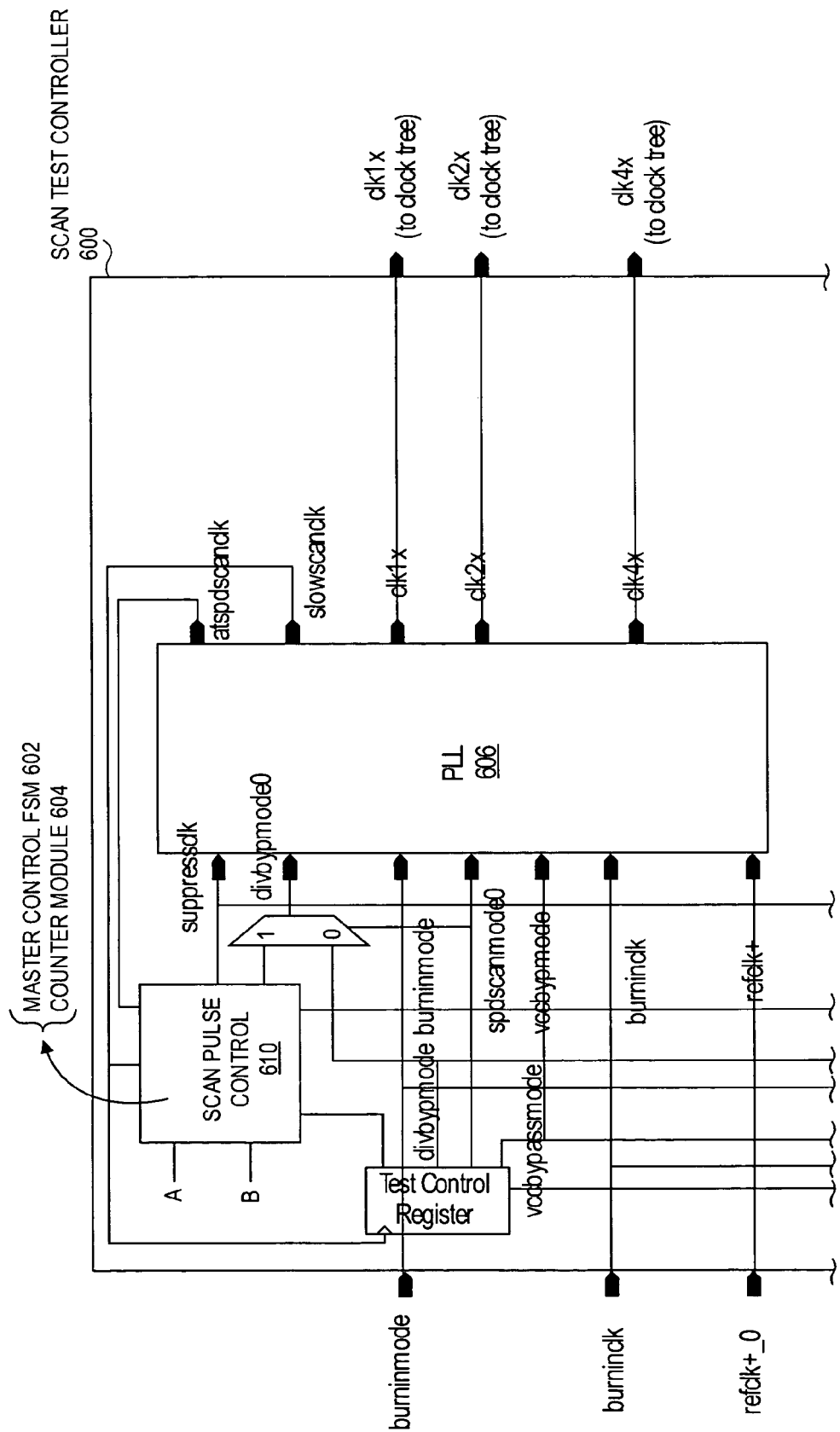
FIG. 6A is a block diagram illustrating one embodiment of a phase-locked loop in accordance with the teachings of the present invention.
Figure 6B:
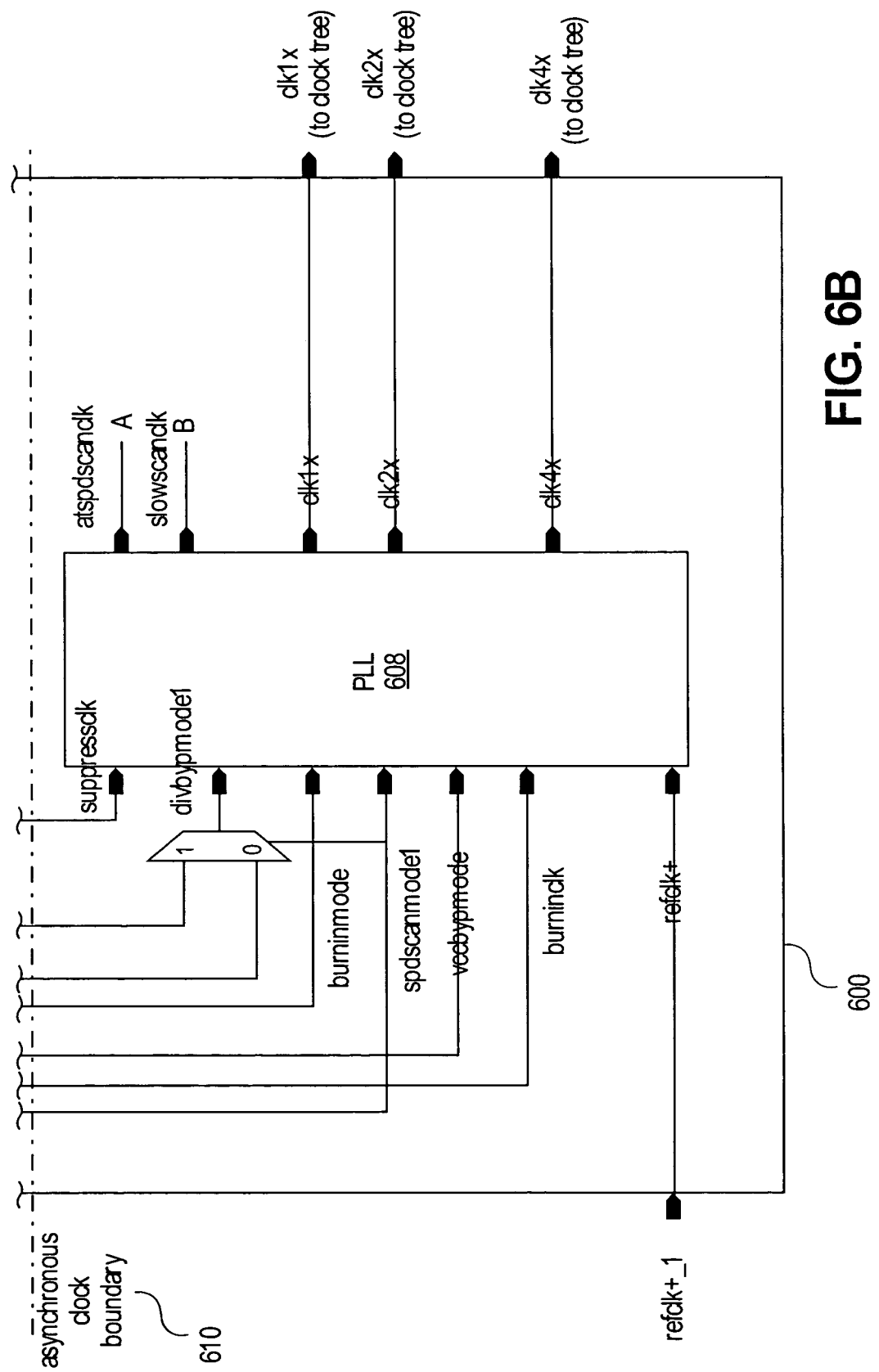
FIG. 6B is a block diagram illustrating one embodiment of a phase-locked loop in accordance with the teachings of the present invention.

Referring to FIGS. 6A and 6B, an embodiment of a scan test controller 600 to control multiple time domains is shown. Scan test controller 600 includes a PLL 606 for use with mode 0, and a PLL 608 for use with mode 1. The asynchronous clock boundary is shown at 610.

Scan test controller 600 also includes a scan pulse control 610. Scan pulse control 610 includes a master control FSM 602 and a counter module 604. CM 604 is substantially similar to the CMs at the distributed slave counters and is used for handshaking between the scan test controller 600 and the DSCs under control of scan test controller 600.

PLLs 606 and 608 produce clock signals during all modes. However, only one time domain performs a capture, as controlled by spdscanmode0 and spdscanmode1. As discussed above, the ATPG vectors may be clock restricted. PLL time domains not under test by the current ATPG patterns may have scan chain inputs constrained to either 0 or 1 in a given pattern to preserve simulation behavior. This is needed since the clock trees in the time domains not selected by spdscanmode are insulated from the last shift pulse by the assertion of suppressclk.

Figure 7:
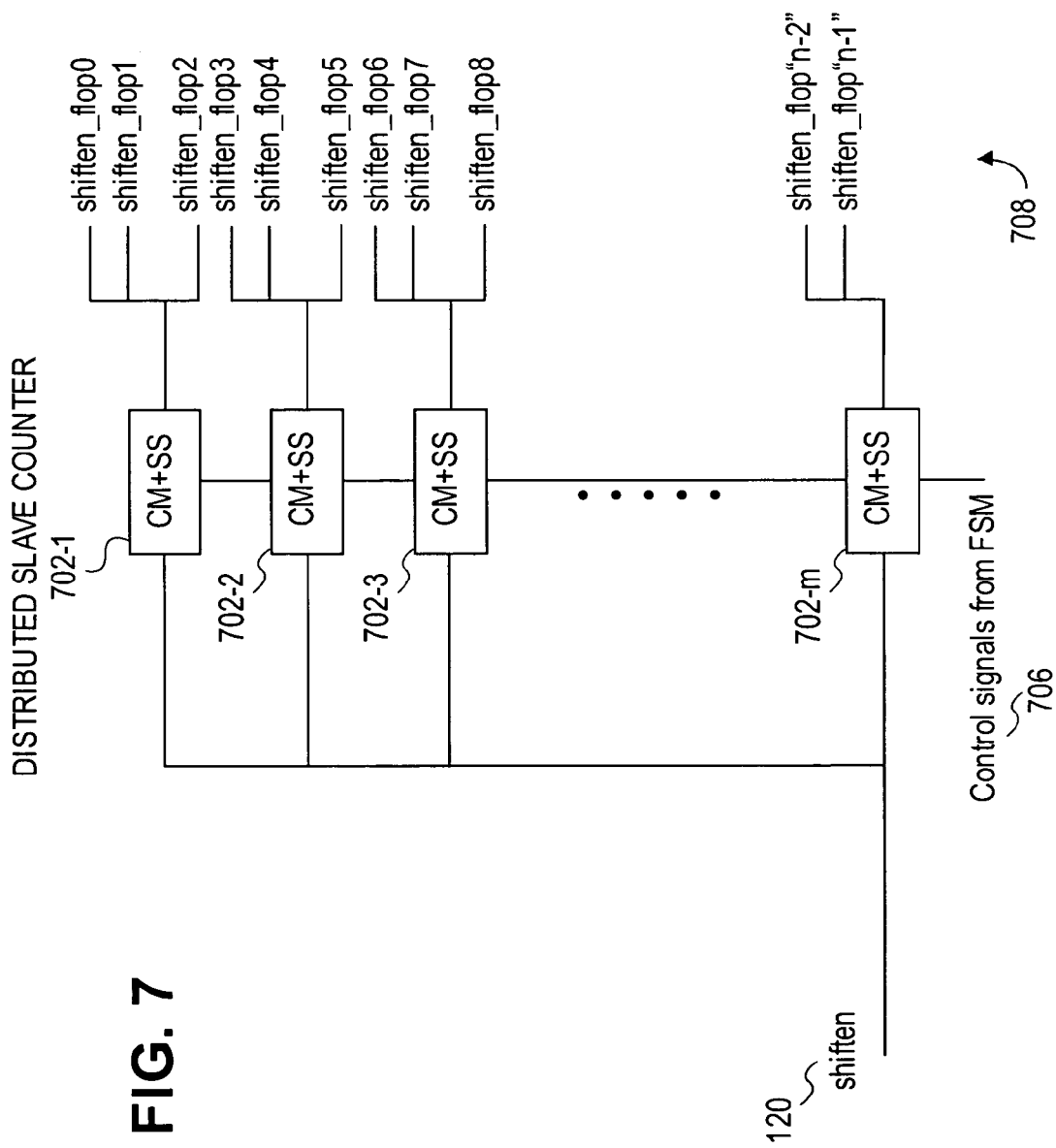
FIG. 7 is a block diagram illustrating one embodiment of distributed slave counters in accordance with the teachings of the present invention.

Turning now to FIG. 7, an embodiment of distributed slave counters 702-1 to 702-m is shown, where 'm' is the number of DSCs. Each DSC 702-1 to 702-m includes a CM and a SS. Each DSC receives the shiften signal 120 as well as control signals 706 from the master control FSM 300.

DSCs 702-1 to 702-m output shiften_flop signals 0 to "n−1" to be received by 'n' scan chains, that is, one shiften_flop per scan chain. In one embodiment, the scan chains include a dummy FF at the beginning of each scan chain (discussed further below in conjunction with FIG. 12). In general, during the RDY and CNT states of master control FSM 300, shiften_flop signals 0 to "n−1" are based on shiften, but during the BUSY state, shiften_flop signals 0 to "n−1" are based on logic local to each DSC in order to capture the at-speed test of the combinatorial circuits.

Figure 9:
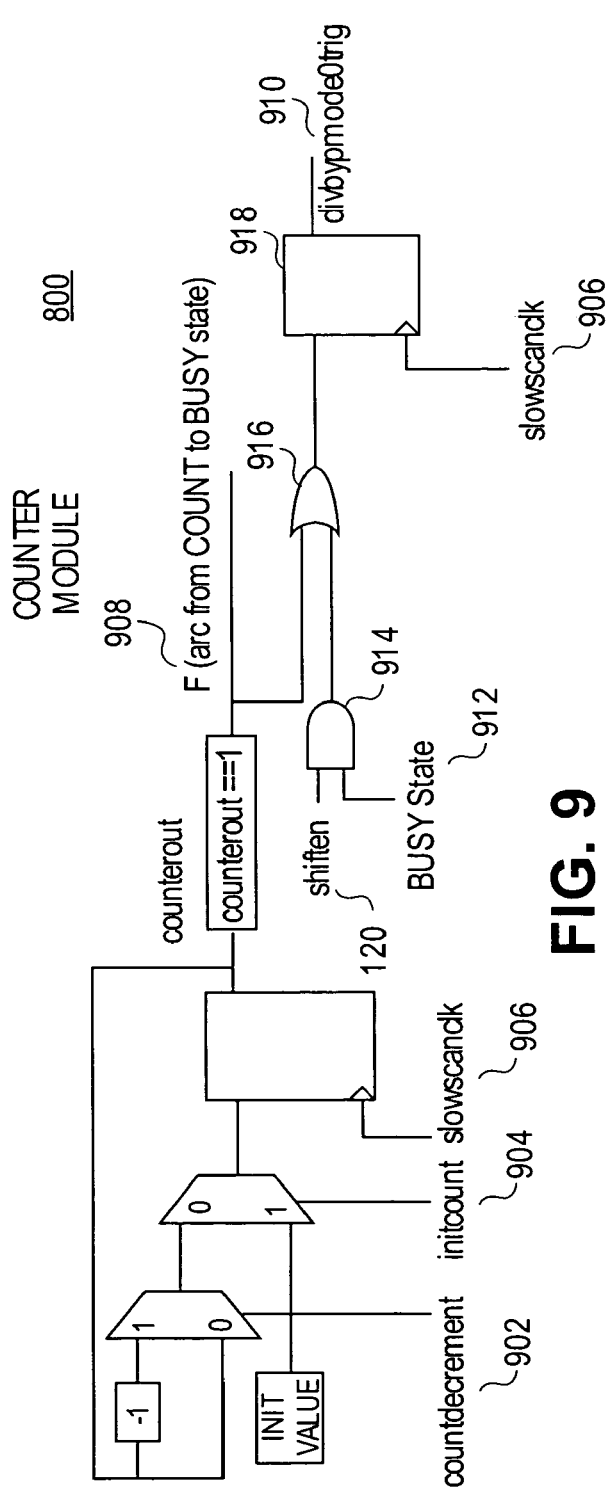
FIG. 9 is a block diagram illustrating one embodiment of a counter module in accordance with the teachings of the present invention.
Figure 8:
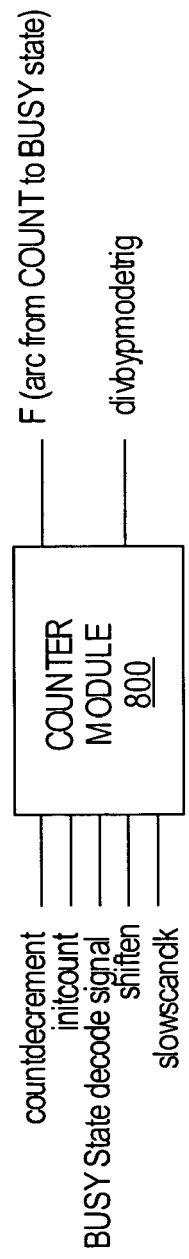
FIG. 8 is a block diagram illustrating one embodiment of a counter module in accordance with the teachings of the present invention.

Referring to FIGS. 8 and 9, an embodiment of a counter module 800 is shown. Countdecrement 902 and initcount 904 are inputted by the master control FSM 300. Slowscanclk 906 is inputted from the PLL.

When the counter logic of CM 800 reaches 1, a signal is sent to the master control FSM 300, as shown at 908. In one embodiment, only one CM from all the DSCs needs to send signal 908 to the master control FSM 300 because all DSC's are decrementing from the same initial value and are all under the control of FSM 300.

Also, when counterout is one and shiften is active, the dividers-bypass-mode-trigger divbymodetrig signal goes active on the next down edge of slowscanclk 906. As described below, divbymode0trig 910 begins the generation of the window for the at-speed scan pulses.

BUSY state signal 912 indicates when master control FSM 300 is in a BUSY state. BUSY state signal 912 is used to provide a distributed BUSY state signal at each DSC. This distributed BUSY state signal is outputted from CM 800 as divbypassmode0trig 910. In this way, the indication of the BUSY state may be generated close to the scan chains instead of being sent from the scan test controller.

AND-gate 914 ensures that the BUSY state signal 912 is only passed to FF 918 when shiften 120 is active. The output of AND-gate 914 is passed through OR-gate 916 with counterout=1. The output of OR-gate 916 is held at FF 918. The state of FF 918 is forwarded as divbypassmode0trig 910 at the negative edge of slowscanclk 906. The logic described above ensures each DSC outputs a divbypassmode0trig 910 at the same slowscanclk 906 negative edge for synchronization between all DSCs.

Referring to FIGS. 10 and 11, an embodiment of a synchronization/shift generator (SS) module 1000 is shown. In FIG. 11, SS 1000 receives the (divbypmode0trig) signal from CM 800.

In the embodiment of FIG. 11, shiften_flop 708 is an AND function of the externally inputted shiften signal and an internally generated local signal called scan capture window (scancapturewindow) 1102. Scancapturewindow 1102 is triggered by divbypmode0trig 910 from CM 800. CM 800 is under control of master control FSM 300.

The scancapturewindow signals at the DSCs are synchronized with atspdscanclk using synchronization FFs 1101-1104. The scancapturewindow signals are normally inactive. The divbypmodetrig signal that is generated separately by each CM needs to be clock crossed into the atspdscanclk domain on the same clock edge for proper coordination between all DSCs. Synchronization FFs 1101-1104 and their associated signals will be discussed below in conjunction with FIG. 14.

The scancapturewindow signals are active only during the second atspdscanclk pulse of the active mode to ensure an at-speed last shift is followed by an at-speed capture. This technique allows the shift start event of the scan chains to be controlled by the external shiften 120 while the capture-start and the capture-end events are controlled locally at the DSCs by internal signals. These internal signals include scancapturewindow, divbypmode, atspdscanclk. FIG. 11 will be discussed further in connection with the timing diagrams of FIGS. 13 and 14.

Figure 12:
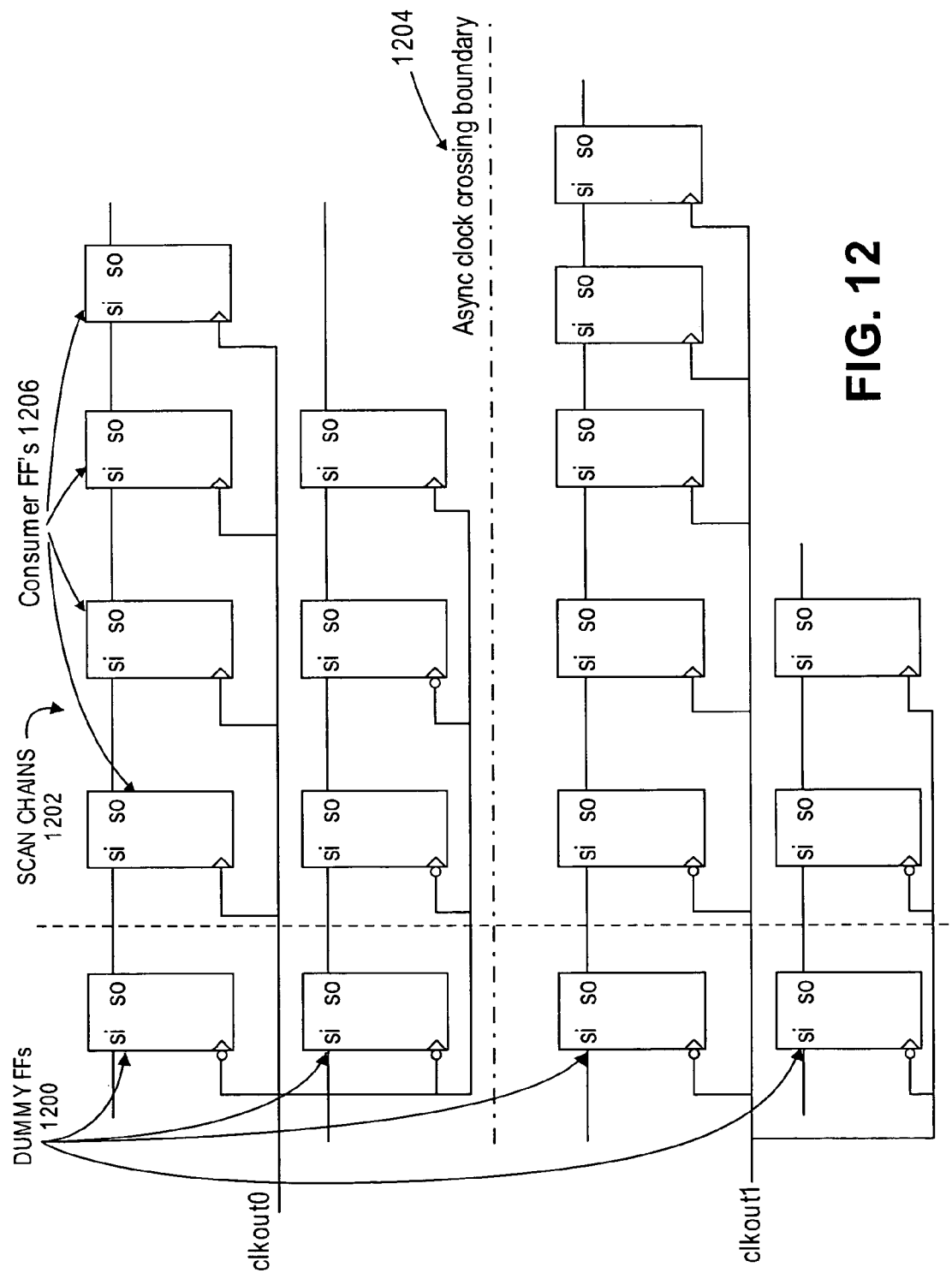
FIG. 12 is a block diagram illustrating one embodiment of dummy flip-flops in accordance with the teachings of the present invention.

Turning to FIG. 12, an embodiment of dummy FFs 1200 is shown. The dummy FFs 1200 are at the beginning of the scan chains 1202. In short, dummy FFs 1200 allow embodiments of a combinatorial at-speed scan tester as described herein to be compatible with legacy ATPG tools.

In one embodiment, the consumer FFs 1206 have a test mode and a functional mode. During the test mode, consumer FFs 1206 are coupled together in scan chains 1202 by the signal-in (si) and signal-out (so) terminals. The consumer FFs 1206 each also have a data input (not shown) for use in the functional mode. The shiften_flop signal received at each scan chain selects the consumer FFs 1206 between the test mode (shiften_flop active and data is loaded from si) and functional mode (shiften_flop inactive and data loaded at data input). In embodiments herein, the consumer FFs 1206 are used in a dual mode for launching the test pattern into the combinatorial circuit and capturing the results. In another embodiment, the consumer FFs 1206 are also tested.

Since the last shift pulse is automatically generated internally by each DSC during the second-to-last shift time interval of the external ATPG reference, this last shift pulse may shift incorrect data into the scan chains. To prevent this behavior, an additional negative clock edge triggered FF needs to be added at the beginning of each scan chain. Dummy FFs 1200 serve as these additional FFs. Dummy FFs 1200 are masked as to comparison and their output may not influence any internal logic of the combinatorial circuit under test. FIG. 12 shows two time domains (clkout0 for mode 0 and clkout1 for mode 1) separated by an asynchronous clock crossing boundary 1204. In one embodiment, slow speed clocking signals and at-speed clocking signals are received at clkout0 when mode 0 is selected.

Figure 13:
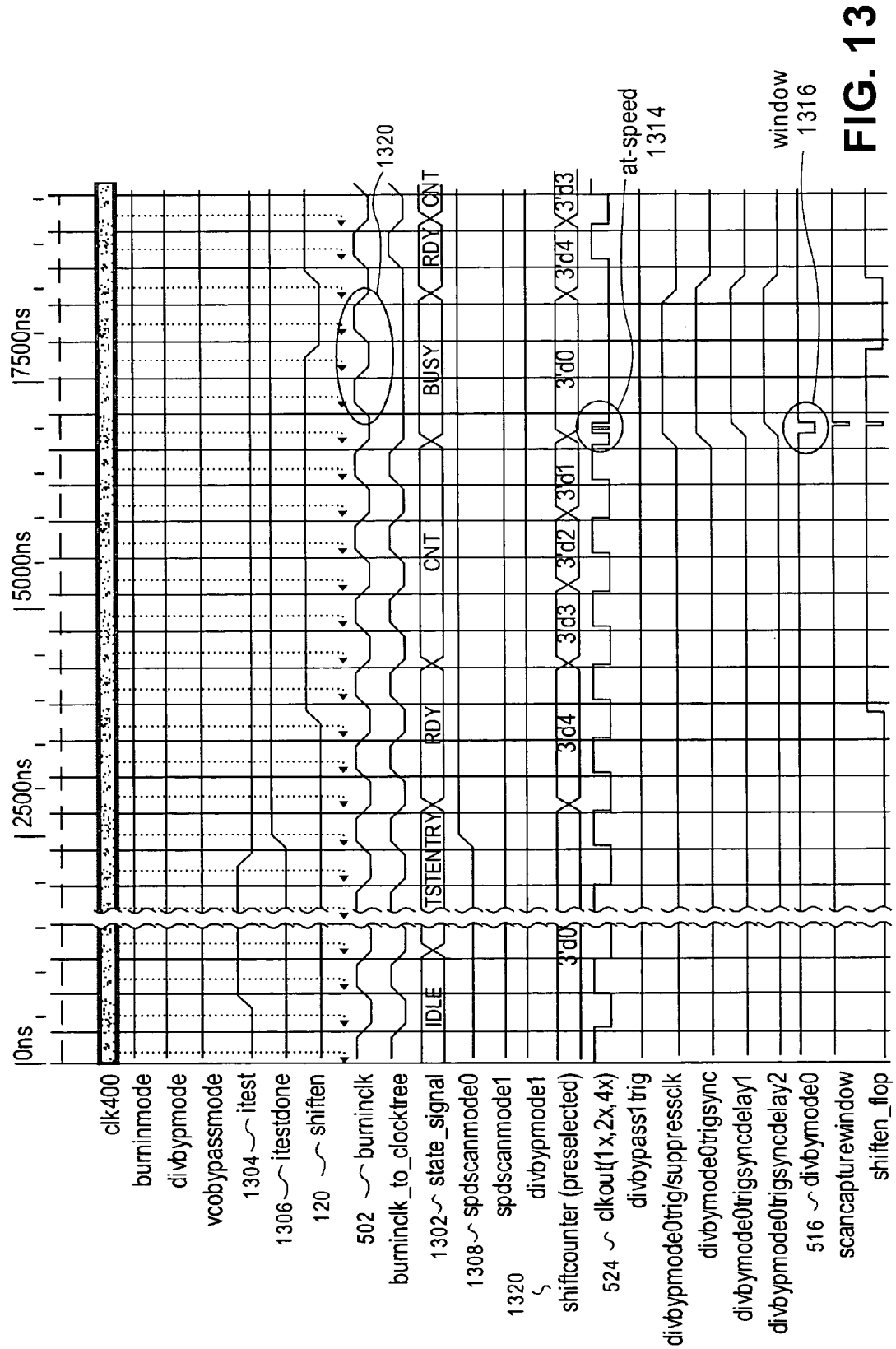
FIG. 13 is a timing diagram illustrating one embodiment of combinatorial at-speed testing in accordance with the teachings of the present invention.
Figure 14:
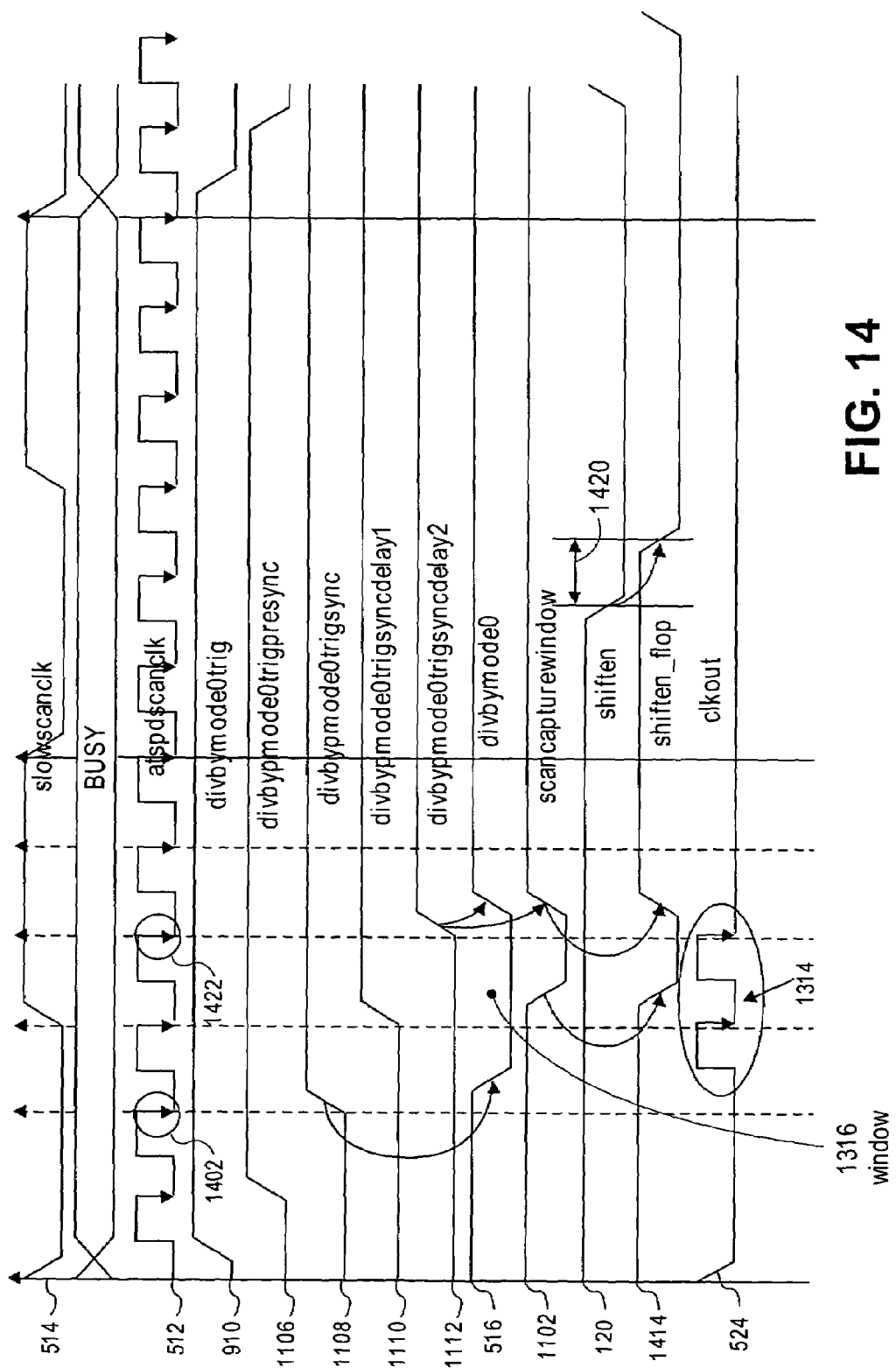
FIG. 14 is a timing diagram illustrating one embodiment of combinatorial at-speed testing in accordance with the teachings of the present invention.

Referring to FIGS. 13 and 14, timing diagrams of an embodiment of the present invention are shown. FIG. 13 shows an embodiment of combinatorial at-speed scan testing through the various states of the master control FSM 300, as shown by state signal 1302. FIG. 14 shows signal transitions during the BUSY state when the window is opened and closed for the at-speed clock pulses to pass to the consumer FFs. The embodiment of FIG. 13 uses a scan chain with four storage cells, as shown by four shifts at shift counter (shiftcounter) signal 1320.

State_signal 1302 shows that the master control FSM 300 starts at IDLE 302. State_signal 1302 transitions to TSTENTRY 304 when itest 1304 becomes active. When itestdone 1306 and scanspdmode0 1308 are activated, the master control FSM 300 transitions to RDY. In the embodiment of FIGS. 13 and 14, mode 0 is the selected time domain.

Master control FSM 300 holds at RDY until shiften 120 is activated. At this time, the master control FSM 300 transitions to the CNT state. Master control FSM 300 holds at RDY until the counter output (counterout) signal is 1. When counterout reaches 1, then master control FSM 300 transitions to BUSY.

At BUSY, countdecrement is held at 0 and suppressclk goes active. As discussed above in conjunction with FIG. 5, suppressclk 510 multiplexes out the slow speed clock. Thus, the slow-speed clock pulses shown at clkout 524 are multiplexed out and two at-speed pulses 1314 are substituted in clkout 524 from dividers 528. Divbypmode0 516 opens the window 1316 that allows the at-speed pulses 1314 to pass to the consumer FFs. Burninclk 502 continues to send two slow-speed pulses 1320 that normally result in the clkout 524. However, the slow-speed clock pulses from burninclk 1322 never reach the consumer FFs because suppressclk 510 goes active in BUSY and multiplexes out burninclk 502 (see FIG. 5).

When shiften 120 is de-asserted, the master control FSM 300 transitions back to the RDY state. During the transition from BUSY to RDY, initcount is set to 1. When at RDY, initcount is set to 0. Suppressclk is also set to 0 at RDY (refer to output signals 312 of FIG. 3).

Turning to FIG. 14, a timing diagram associated with the BUSY state of master control FSM 300 is shown. During the BUSY state, the slow-speed pulse is suppressed during the window period and the consumer FFs receive the two at-speed pulses. The following discussion of FIG. 14 will also reference FIG. 11.

Divbypmode0trig 910 is delayed by synchronization FFs 1101-1104 and atspdscanclk 512 for synchronization control and to prevent clock-crossing metatestability issues. Divbypmode0trig 910 goes active in the BUSY state and is inputted into synchronization FF 1101. Synchronization FF 1101 outputs divbymode0trigpresync 1106 that is inputted into synchronization FF 1102. Synchronization FF 1102 outputs divbymode0trigsync 1108. Divbymode0trigsync 1108 is inputted into synchronization FF 1103. Synchronization FF 1103 outputs divbymode0trigsyncdelay1 1110 that is inputted into synchronization FF 1104. Synchronization FF 1104 outputs divbymode0trigsyncdelay2 1112. As shown in FIG. 14, divbymode0trigpresync 1106, divbymode0trigsync 1108, divbymode0trigsyncdelay1 1110 and divbymode0trigsyncdelay2 1112 are triggered by the negative edge of atspdscanclk 512.

Divbypmode0 516 is a combination of divbymode0trigsync 1108 and divbymode0trigsyncdelay2 1112. As discussed in conjunction with FIG. 5, when divbypmode0 516 goes inactive, the at-speed clock pulses are allowed through to the consumer FFs from clkout 524. Divbypmode0 516 defines window 1316 for the two at-speed pulses 1314.

During the first pulse of at-speed pulses 1314, shiften-flop 1414 remains active. This first at-speed pulse serves as the last-shift for the scan chain. The last-shift also serves as the launch event.

Once divbymode0trigsyncdelay1 1110 goes active, scancapturewindow 1102 opens by going inactive. Scancapturewindow 1102 going inactive causes shiften_flop 1414 to go inactive. Thus, at the second pulse of at-speed pulses 1314, the capture event occurs. When divbymode0trigsyncdelay2 1112 goes active, this causes scancapturewindow 1102 to close by going active again and shiften_flop 1414 to go active.

Also, divbymode0trigsyncdelay2 1112 going active causes divbypmode0 516 to return to an active state. Thus, divbypmode0 516 can multiplex in the slow speed clock to clkout 524. However, since suppressclk 510 is still high during BUSY, clkout 524 is not forwarded because of mux 532 (see FIG. 5). As seen in FIG. 14, slowscanclk 514 and atspdscanclk 512 continue to be active during the BUSY state. When the slow speed and at-speed clock signals are allowed to reach the consumer FFs is controlled by the master control FSM 300 though PLL 400.

The timing of window 1316 is guaranteed because window 1316 is generated by atspdscanclk 512 itself. Down edge 1402 of atspdscanclk 512 starts the window 1316 of divbymode0 1318 via divbymode0trigsync 1108. In turn, window 1316 is closed by down edge 1422 that causes divbymode0trigsyncdelay2 1112 to go active.

The linking of the atspdscanclk 512 to the size of window 1316 leads to the scalability of embodiments of the present invention. If the speed of atspdscanclk 512 is increased, then the size of window 1316 is shrunk accordingly. Thus, the use of the two at-speed pulses in the window may be easily adjusted. In one embodiment, the speed of the atspdscanclk 512 may be adjusted to determine at what speed a particular defect occurs. Since the window size and launch-capture events are coordinated from atspdscanclk 512, the same test pattern may be repeatedly applied to the same consumer FFs using different PLL frequencies.

To ensure that all DSCs behave in the same fashion and are coordinated in timing, the relationship between slowscanclk 514 and atspdscanclk 512 is controlled at the scan test controller 104. The window 1316 in each DSC is started by the same down edge 1402 of the same atspdscanclk 512. As described above, the atspdscanclk 512 is generated by the PLL and distributed to all of the DSCs.

Delay 1420 shows the propagation delay for the external shiften 120 to reach the consumer FFs in processor 100. This natural propagation delay normally aggravates the successful timing of at-speed tests. By using shiften_flop at the DSCs that are physically close to their consumer FFs, the propagation delay is minimized.

Embodiments of the present invention combine the launch-off-shift and broadside techniques. Testers may use legacy ATPG tools to produce efficient combinatorial test patterns, similarly as to launch-off-shift. However, as with the broadside technique, the test pattern is shifted in at slow speed, while the launch and capture events are conducted at-speed by an internal clock. Thus, the advantages of the broadside technique are folded into launch-off-shift. This may provide large functional at-speed coverage while reducing unnecessary yield loss. Embodiments herein add scalability for future faster processors and offer debug capability for present designs due to at-speed clock control.

FIG. 15 illustrates one embodiment of a testing system in accordance with one embodiment of the present invention. The testing system includes a test computer 1502 coupled to automatic test equipment (ATE) 1506 via a wired connection, a wireless connection, over a network, or any combination thereof. ATE 1506 includes a socket, or other coupling device, for receiving processor 100.

Test computer 1502 includes a processor and a memory device. Test computer 1502 may also include storage, non-volatile storage (NVS), network interface, and Input/Output (I/O) devices, such as a keyboard and mouse. Test computer 1502 may also include an ATPG tool 1504, such as, for example, FASTSCAN®, TetraMAX®, or the like. In one embodiment, ATPG tools may be used to generate ATPG vectors with a sequential depth setting of zero.

Test computer 1502 executes ATPG tool 1504 to test processor 100 using combinatorial at-speed scan tester 102. ATPG vectors are sent to tester 102 via ATE 1506 for testing processor 100. The results of the testing are collected and stored at test computer 1502 by ATPG tool 1504.

The above description of illustrated embodiments of the invention, including what is described in the Abstract, is not intended to be exhaustive or to limit the embodiments to the precise forms disclosed. While specific embodiments of, and examples for, the invention are described herein for illustrative purposes, various equivalent modifications are possible, as those skilled in the relevant art will recognize. These modifications can be made to embodiments of the invention in light of the above detailed description.

The terms used in the following claims should not be construed to limit the invention to the specific embodiments disclosed in the specification. Rather, the following claims are to be construed in accordance with established doctrines of claim interpretation.

What is claimed is:

1. A processor, comprising:
   a plurality of distributed slave counters, wherein each distributed slave counter of the plurality of slave counters is coupled to a group of scan chains, each distributed slave counter to generate shift-enable-flop signals to be received by the group of scan chains coupled to each distributed slave counter, the shift-enable-flop signals based at least in part on an external shift-enable signal received by the processor; and
   a scan test controller coupled to the plurality of distributed slave counters to provide control signals to the plurality of distributed slave counters to perform an at-speed test of the processor.

2. The apparatus of claim 1 wherein the scan test controller includes:
   a master control finite state machine; and
   a first phase-locked loop coupled to the master control finite state machine, the first phase-locked loop to generate at-speed clock pulses for a first time domain of the at-speed test.

3. The apparatus of claim 2, wherein the scan test controller includes a second phase-locked loop coupled to the master control finite state machine, the second phase-locked loop to generate at-speed clock pulses for a second time domain of the at-speed test.

4. The apparatus of claim 2 wherein the first phase-locked loop includes logic to prevent slow-speed clock signals from being sent to the groups of scan chains during the at-speed test.

5. The apparatus of claim 1 wherein each distributed slave counter includes:
   a counter module to output a dividers-bypass-mode-trigger signal to initiate the at-speed test at each scan chain; and
   a synchronization and shift generator module coupled to the counter module to output the shift-enable-flop signal to each scan chain.

6. The apparatus of claim 1 wherein the shift-enable-flop signals are active during a first at-speed pulse associated with a last-shift of each scan chain, wherein the last-shift serves as a launch event of the at-speed test.

7. The apparatus of claim 1 wherein the shift-enable-flop signals are inactive during a second at-speed pulse associated with a capture event of the at-speed test.

8. The apparatus of claim 1 wherein each scan chain includes a dummy flip-flop at the beginning of the scan chain.

9. A system, comprising:
   an Automatic Test Pattern Generation (ATPG) tool; and
   a processor including a combinatorial at-speed scan tester coupled to the ATPG tool, the combinatorial at-speed scan tester including:
   a plurality of consumer flip-flops coupled to a combinatorial circuit of the processor; and
   a distributed slave counter coupled to the plurality of consumer flip-flops, wherein the distributed slave counter to generate a shift-enable-flop signal based at least in part on an external shift-enable signal received by the processor from the ATPG tool, the shift-enable-flop signal to be received by the plurality of consumer flip-flops during an at-speed test of the combinatorial circuit.

10. The system of claim 9 wherein the shift-enable-flop signal is active during the launch of a test pattern in a scan chain formed by the plurality of consumer flip-flops into the combinatorial circuit, the test pattern received from the ATPG tool, the launch to occur during a first at-speed clock pulse.

11. The system of claim 10 wherein the shift-enable-flop signal is inactive during the capture of the test pattern in the scan chain, the capture to occur during a second at-speed clock pulse.

12. The system of claim 9, further comprising a dummy flip-flop coupled to the plurality consumer flip-flops when the shift-enable-flop signal is active to form a scan chain from the consumer flip-flops, the dummy flip-flop at the beginning of the scan chain.

13. The system of claim 9, further comprising a scan test controller coupled to the distributed slave counter to provide control signals to the distributed slave counter during the at-speed test, the scan test controller including;
a master control finite state machine;
a first phase-locked loop coupled to the master control finite state machine to generate at-speed clock pulses for a first at-speed time domain; and
a second phase-locked loop coupled to the master control finite state machine to generate at-speed clock pulses for a second at-speed time domain.

14. A method, comprising:
shifting in a combinatorial test pattern into scan chains of a processor using a slow-speed clock;
distributing a shift-enable-flop signal to the scan chains using a plurality of distributed slave counters, each distributed slave counter associated with a group of scan chains, the shift-enable-flop signal based at least in part on a shift-enable signal received at the processor; and
performing an at-speed test of the processor using an at-speed clock of the processor, wherein performing the at-speed test comprises:
performing a last-shift using the at-speed clock, wherein the shift-enable-flop signal is active during the last-shift; and
capturing the at-speed test using the at-speed clock, wherein the shift-enable-flop signal is inactive during the capture.

15. A method, comprising:
shifting in a combinatorial test pattern into scan chains of a processor using a slow-speed clock;
distributing a shift-enable-flop signal to the scan chains using a plurality of distributed slave counters, each distributed slave counter associated with a group of scan chains, the shift-enable-flop signal based at least in part on a shift-enable signal received at the processor;
performing an at-speed test of the processor using an at-speed clock of the processor; and
preventing pulses from the slow-speed clock from reaching the scan chain during the at-speed test.

16. A method, comprising:
shifting in a combinatorial test pattern into scan chains of a processor using a slow-speed clock;
distributing a shift-enable-flop signal to the scan chains using a plurality of distributed slave counters, each distributed slave counter associated with a group of scan chains, the shift-enable-flop signal based at least in part on a shift-enable signal received at the processor;
performing an at-speed test of the processor using an at-speed clock of the processor; and
generating at-speed clock pulses using a first phase-locked loop, the first phase-locked loop on-board the processor.

17. The method of claim 16, further comprising generating the at-speed clock pulses using a second phase-locked loop on-board the processor, the second phased-locked loop to generate clock pulses for a different clock domain than the first phase-locked loop.

18. A method, comprising:
shifting in a combinatorial test pattern into scan chains of a processor using a slow-speed clock;
distributing a shift-enable-flop signal to the scan chains using a plurality of distributed slave counters, each distributed slave counter associated with a group of scan chains, the shift-enable-flop signal based at least in part on a shift-enable signal received at the processor;
performing an at-speed test of the processor using an at-speed clock of the processor; and
sending control signals from a scan test controller to the distributed slave counters, wherein the scan test controller includes a master control finite state machine.

19. The method of claim 18, further comprising generating a distributed busy state signal at each distributed slave counter, the distributed busy state signal based at least in part on a busy state of the master control finite state machine.

20. A method, comprising:
shifting in a combinatorial test pattern into scan chains of a processor using a slow-speed clock;
distributing a shift-enable-flop signal to the scan chains using a plurality of distributed slave counters, each distributed slave counter associated with a group of scan chains, the shift-enable-flop signal based at least in part on a shift-enable signal received at the processor, wherein each scan chain includes a dummy flip-flop at the beginning of each scan chain to enable scan testing using legacy Automatic Test Pattern Generation (ATPG) tools; and
performing an at-speed test of the processor using an at-speed clock of the processor.

* * * * *